United States Patent
Kotaka et al.

(10) Patent No.: US 9,436,227 B2
(45) Date of Patent: Sep. 6, 2016

(54) FRAME STRUCTURE OF ELECTRONIC DEVICE

(71) Applicant: Sony Corporation, Tokyo (JP)

(72) Inventors: Hiroshi Kotaka, Nagano (JP); Hiroyoshi Ishizuka, Nagano (JP)

(73) Assignee: Sony Corporation, Tokyo (JP)

( * ) Notice: Subject to any disclaimer, the term of this patent is extended or adjusted under 35 U.S.C. 154(b) by 314 days.

(21) Appl. No.: 14/132,209

(22) Filed: Dec. 18, 2013

(65) Prior Publication Data
US 2014/0192468 A1  Jul. 10, 2014

(30) Foreign Application Priority Data
Jan. 4, 2013 (JP) .................. 2013-000162

(51) Int. Cl.
*G06F 1/16* (2006.01)
*G06F 1/20* (2006.01)
*H05K 5/00* (2006.01)

(52) U.S. Cl.
CPC .......... *G06F 1/1658* (2013.01); *G06F 1/1616* (2013.01); *G06F 1/1656* (2013.01); *G06F 1/203* (2013.01); *H05K 5/0004* (2013.01)

(58) Field of Classification Search
CPC .................................................. G06F 1/1656
USPC ............. 361/679.02, 679.31, 679.55, 748, 361/752–756, 760
See application file for complete search history.

(56) References Cited

U.S. PATENT DOCUMENTS

| | | | | |
|---|---|---|---|---|
| 5,715,139 A | * | 2/1998 | Nakajima | G06F 1/1616 361/679.55 |
| 5,971,566 A | * | 10/1999 | Tani | H05K 7/20972 313/46 |
| 6,160,702 A | | 12/2000 | Lee et al. | |
| 6,198,626 B1 | * | 3/2001 | Nakajima | B60G 17/052 361/679.55 |
| 6,751,089 B2 | * | 6/2004 | Hsieh | G06F 1/1616 235/472.01 |

(Continued)

FOREIGN PATENT DOCUMENTS

EP  2085858 A1  8/2009
JP  08-162781  6/1996

(Continued)

OTHER PUBLICATIONS

Jan. 1, 2015, European Search Report issued for related EP application No. 13198297.7.

(Continued)

*Primary Examiner* — Adrian S Wilson
(74) *Attorney, Agent, or Firm* — Paratus Law Group, PLLC

(57) ABSTRACT

There is provided a portable apparatus including a top layer portion, a bottom layer portion, and a frame layer portion provided between the top layer portion and the bottom layer portion, wherein the frame layer portion is formed of a rigid material and comprises a plurality of compartmented openings, and wherein the compartmented openings are formed as volumes of spaces partitioned by an arrangement of crosspiece portions forming at least a part of the frame layer portion, and a circuitry component constituting a part of the portable apparatus is placed within at least one of the compartmented openings.

19 Claims, 12 Drawing Sheets

(56) References Cited

U.S. PATENT DOCUMENTS

| | | | |
|---|---|---|---|
| 7,457,120 B2 * | 11/2008 | Bae | H05K 7/20963 361/704 |
| 8,050,028 B2 * | 11/2011 | Merz | G02F 1/133308 165/104.21 |
| 8,159,622 B2 * | 4/2012 | Tanaka | H05K 7/20972 348/836 |
| 2001/0015005 A1 * | 8/2001 | Chung | B23P 15/00 29/458 |
| 2002/0154474 A1 | 10/2002 | Merz et al. | |
| 2003/0227742 A1 | 12/2003 | Lam et al. | |
| 2004/0246669 A1 * | 12/2004 | Minaguchi | G06F 1/1656 361/679.09 |
| 2005/0111202 A1 * | 5/2005 | Minaguchi | G06F 1/1616 361/752 |
| 2006/0176659 A1 * | 8/2006 | Sun | G06F 1/1613 361/679.33 |
| 2006/0268502 A1 * | 11/2006 | Liu | G06F 1/1656 361/679.55 |
| 2007/0019373 A1 * | 1/2007 | Yokote | G06F 1/1616 361/679.02 |
| 2007/0025072 A1 * | 2/2007 | Liao | G06F 1/1616 361/679.21 |
| 2007/0223200 A1 * | 9/2007 | Fujiya | H05K 7/20727 361/727 |
| 2007/0230101 A1 * | 10/2007 | Wong | G06F 1/1616 361/679.55 |
| 2010/0091442 A1 * | 4/2010 | Theobald | G06F 1/1616 361/679.09 |
| 2011/0085286 A1 * | 4/2011 | Tanaka | G06F 1/1616 361/679.01 |
| 2011/0182022 A1 * | 7/2011 | Lu | G06F 1/183 361/679.33 |
| 2013/0250509 A1 * | 9/2013 | Tachikawa | G06F 1/1656 361/679.55 |

FOREIGN PATENT DOCUMENTS

| | | |
|---|---|---|
| JP | 2001-036257 | 2/2001 |
| JP | 2006-049382 | 2/2006 |
| JP | 2010-146482 | 7/2010 |

OTHER PUBLICATIONS

Jan. 12, 2016, Japanese Office Action for related JP Application No. 2013-000162.

Feb. 15, 2016, European Office Action for related EP Application No. 13198297.7-1959.

* cited by examiner

FIG. 10
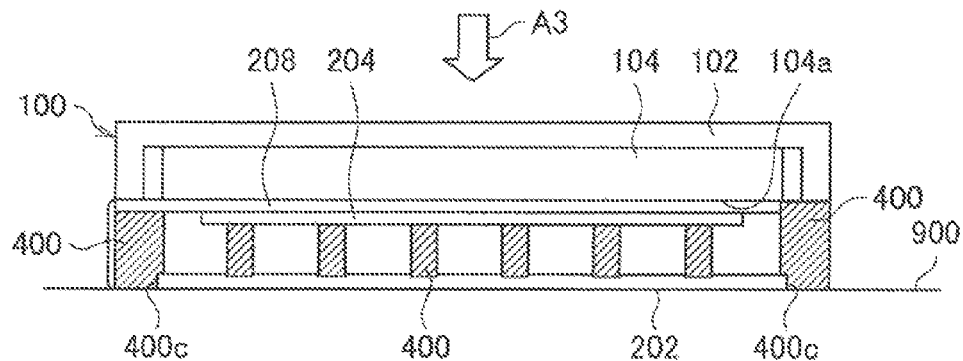
FIG. 11
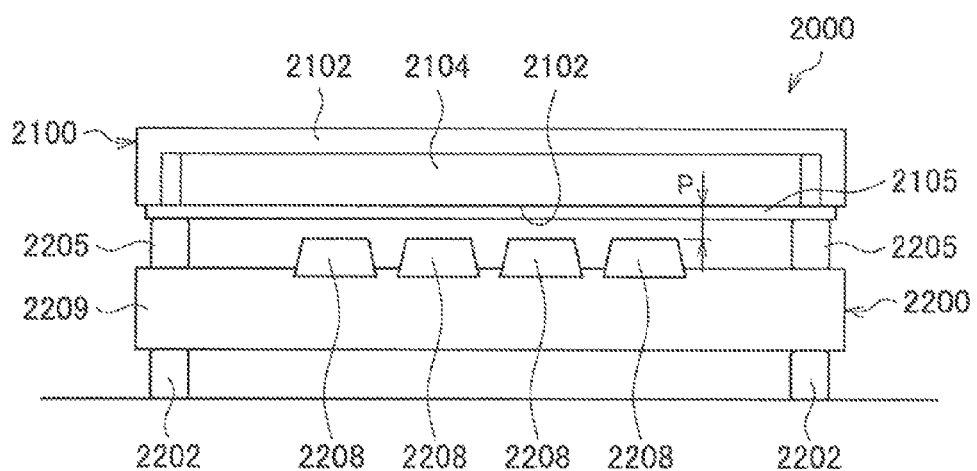
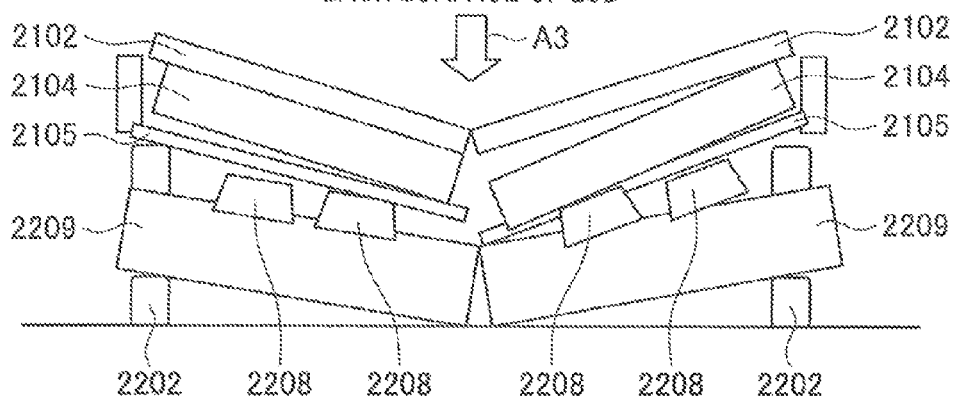

FIG. 12
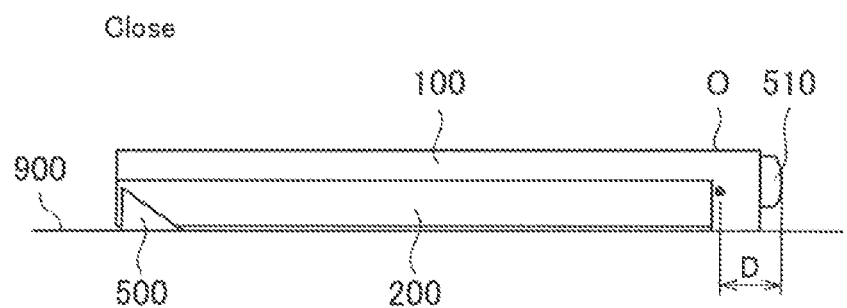
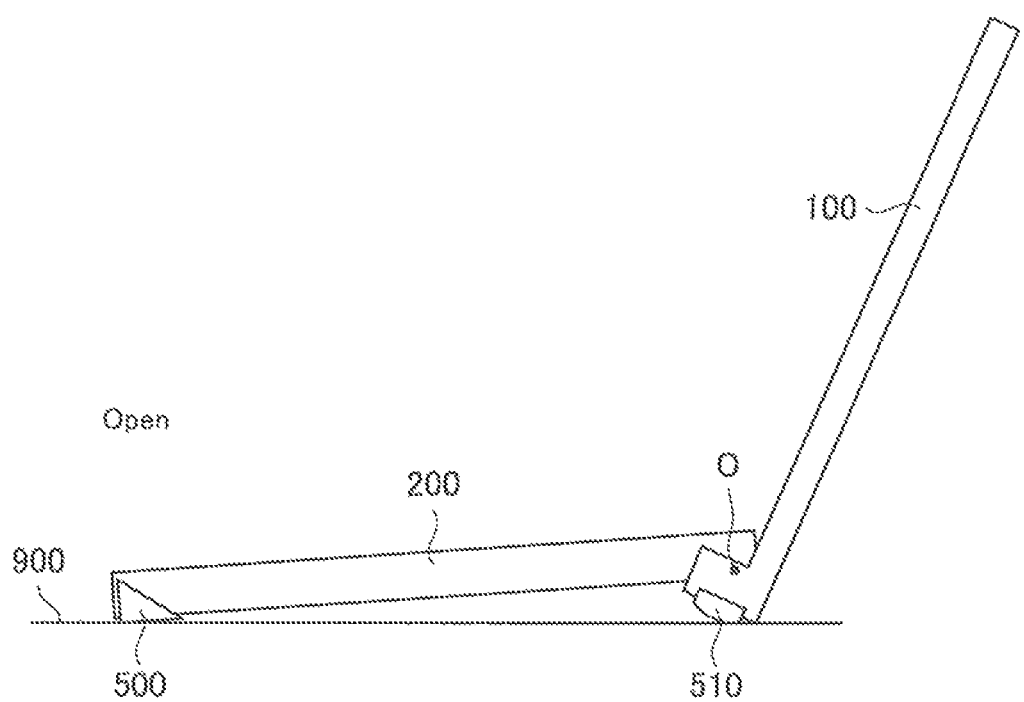

FRAME STRUCTURE OF ELECTRONIC DEVICE

CROSS REFERENCE TO RELATED APPLICATIONS

This application claims the benefit of Japanese Priority Patent Application JP 2013-000162 filed Jan. 4, 2013, the entire contents of which are incorporated herein by reference.

BACKGROUND

The present disclosure relates to a frame structure of an electronic device.

Conventionally, an electronic device including a frame palm rest in which a printed board or a heat radiation unit can be mounted in a laptop-type personal computer is described, for example, in Japanese Patent Laid-Open Publication No. 2010-146482.

SUMMARY

However, in a structure described in Japanese Patent Laid-Open Publication No. 2010-146482, since the frame palm rest is separately arranged inside an exterior member including a palm rest and a bottom, and a printed board or a heat radiation unit is mounted on the frame palm rest, achievement of a thinner type of electronic device is limited. Further, it is difficult to secure rigidity when a thinner type is realized in a configuration in which the printed board or the heat radiation unit is mounted on the frame palm rest arranged separately inside the exterior member.

According to an embodiment of the present disclosure, there is provided a portable apparatus including: a top layer portion; a bottom layer portion; and a frame layer portion provided between the top layer portion and the bottom layer portion, wherein the frame layer portion is formed of a rigid material and comprises a plurality of compartmented openings, and wherein the compartmented openings are formed as volumes of spaces partitioned by an arrangement of crosspiece portions forming at least a part of the frame layer portion, and a circuitry component constituting a part of the portable apparatus is placed within at least one of the compartmented openings.

According to another embodiment of the present disclosure, there is provided a portable apparatus including: a top layer portion; a bottom layer portion; and a frame layer portion provided between the top layer portion and the bottom layer portion, wherein the frame layer portion is a torsionally rigid structure and comprises a plurality of cutout portions configured to accommodate a plurality of electronic components therewithin.

BRIEF DESCRIPTION OF THE DRAWINGS

FIG. 10 is a schematic view illustrating a configuration for suppressing a stress applied to a display surface;

FIG. 11 is a schematic cross-sectional view illustrating a normal laptop-type personal computer in a comparative example;

FIG. 12 is a schematic view illustrating a configuration of rubber feet of an electronic device.

DETAILED DESCRIPTION OF EMBODIMENT(S)

Figure 1:
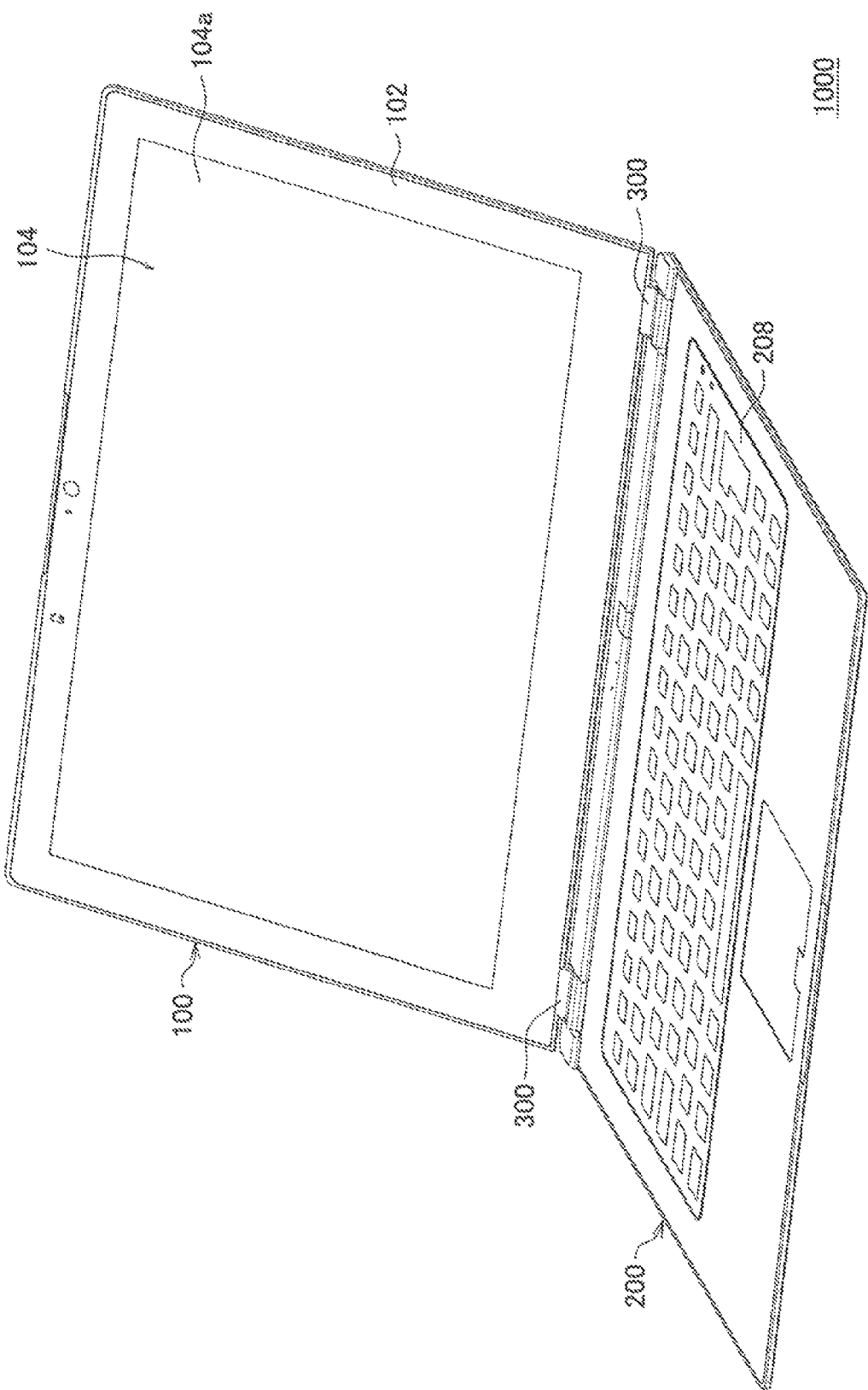
FIG. 1 is a perspective view illustrating an entire configuration of an electronic device.

Hereinafter, embodiments of the present disclosure will be described in detail with reference to the appended drawings. Note that, in this specification and the appended drawings, structural elements that have substantially the same or similar function and structure are denoted with the same reference numerals, and repeated explanation of these structural elements is omitted.

Further, a description will be given in the following order.
1. Entire configuration example of electronic device
2. Configuration example of frame
3. Heat radiation structure of main body unit
4. Arrangement of battery
5. Rigidity of main body unit
6. Configuration of rubber feet

[1. Entire Configuration Example of Electronic Device]

First, a schematic configuration of an electronic device 1000 according to embodiments of the present disclosure will be described with reference to FIG. 1. FIG. 1 is a perspective view illustrating an entire configuration of the electronic device 1000. The electronic device of an embodiment is, for example, a laptop-type personal computer, as illustrated in FIG. 1. The electronic device 1000 includes a display unit 100, a main body unit 200, and hinges 300 which connect the display unit 100 and the main body unit 200, as illustrated in FIG. 1.

Figure 2:
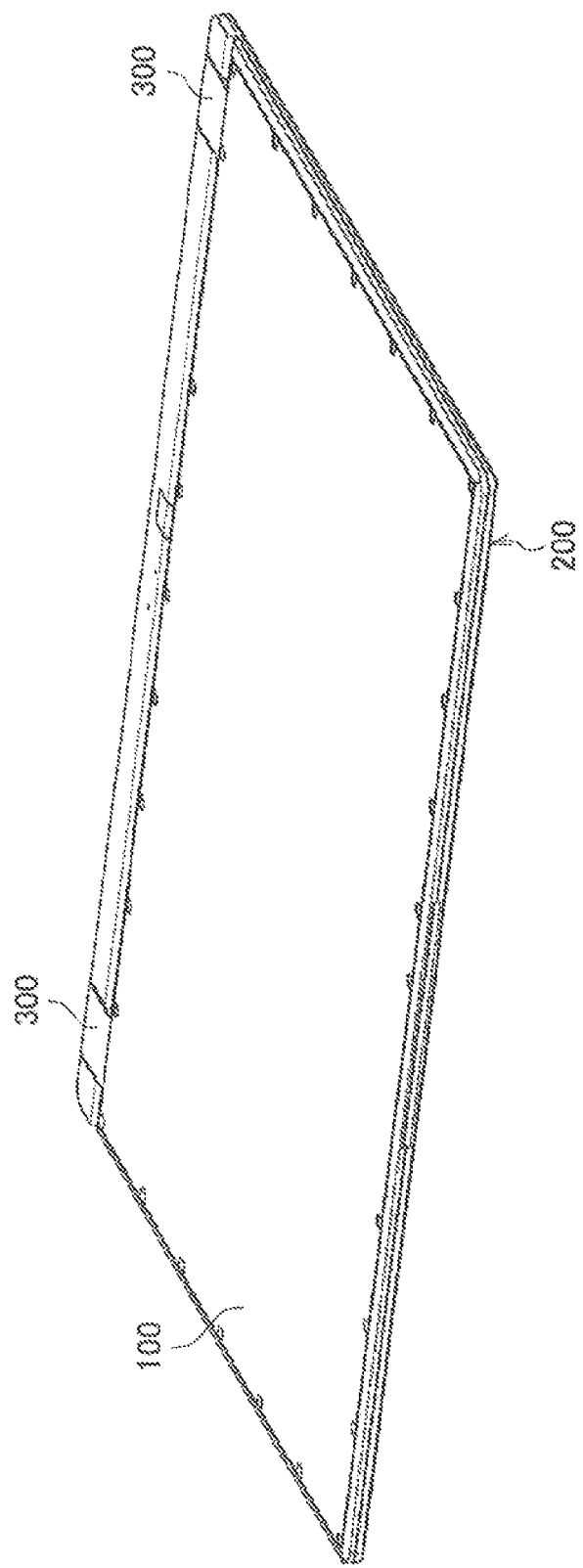
FIG. 2 is a schematic view illustrating a state in which a display unit is closed with respect to a main body unit.

FIG. 1 illustrates a state in which the display unit 100 is opened with respect to the main body unit 200. Further, FIG. 2 illustrates a state in which the display unit 100 is closed with respect to the main body unit 200. Thus, the display unit 100 can be opened or closed with respect to the main body unit 200 through the hinges 300. The display unit 100 includes a display-side housing 102, and an LCD 104 which performs a display process, which is provided in the display-side housing 102. A display surface 104a of the LCD 104 is a screen for displaying information, and is exposed to the outside in a state in which the display unit 100 is opened.

The display-side housing 102 is a housing of the display unit 100 which accommodates the LCD 104. The display surface 104a of the LCD 104 faces the main body unit 200 in a closed state. The two hinges 300 are attached to the display-side housing 102. The display unit 100 is provided to be rotatable with respect to the main body unit 200 due to the two hinges 300.

Figure 3:
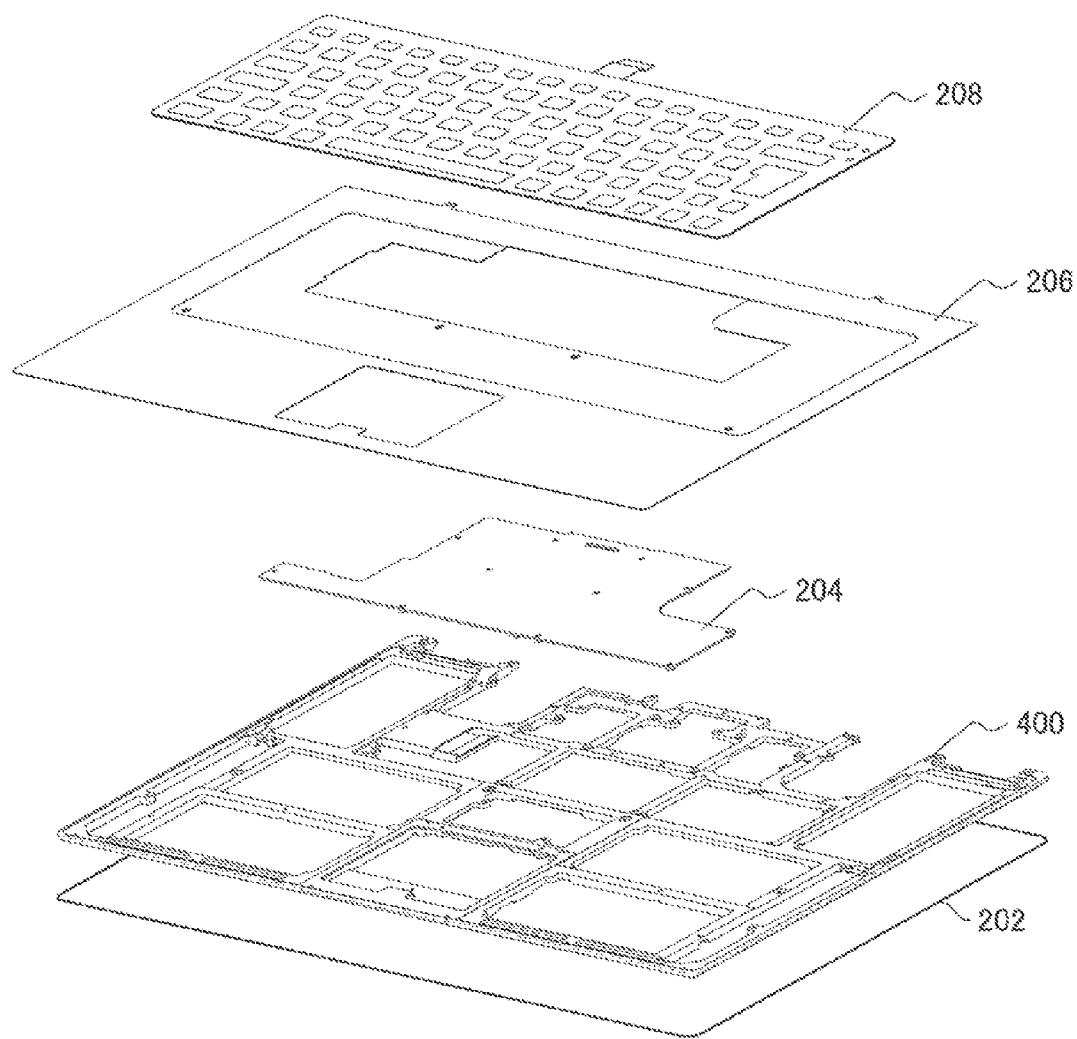
FIG. 3 is an exploded perspective view illustrating a configuration of the main body unit.

FIG. 3 is an exploded perspective view illustrating a configuration of the main body unit 200. The main body unit 200 includes a bottom plate 202, a frame 400, a motherboard 204, a support plate 206, and a keyboard 208, which are stacked sequentially from a bottom, as illustrated in FIG. 3.

[2. Configuration Example of Frame]

Figure 4:
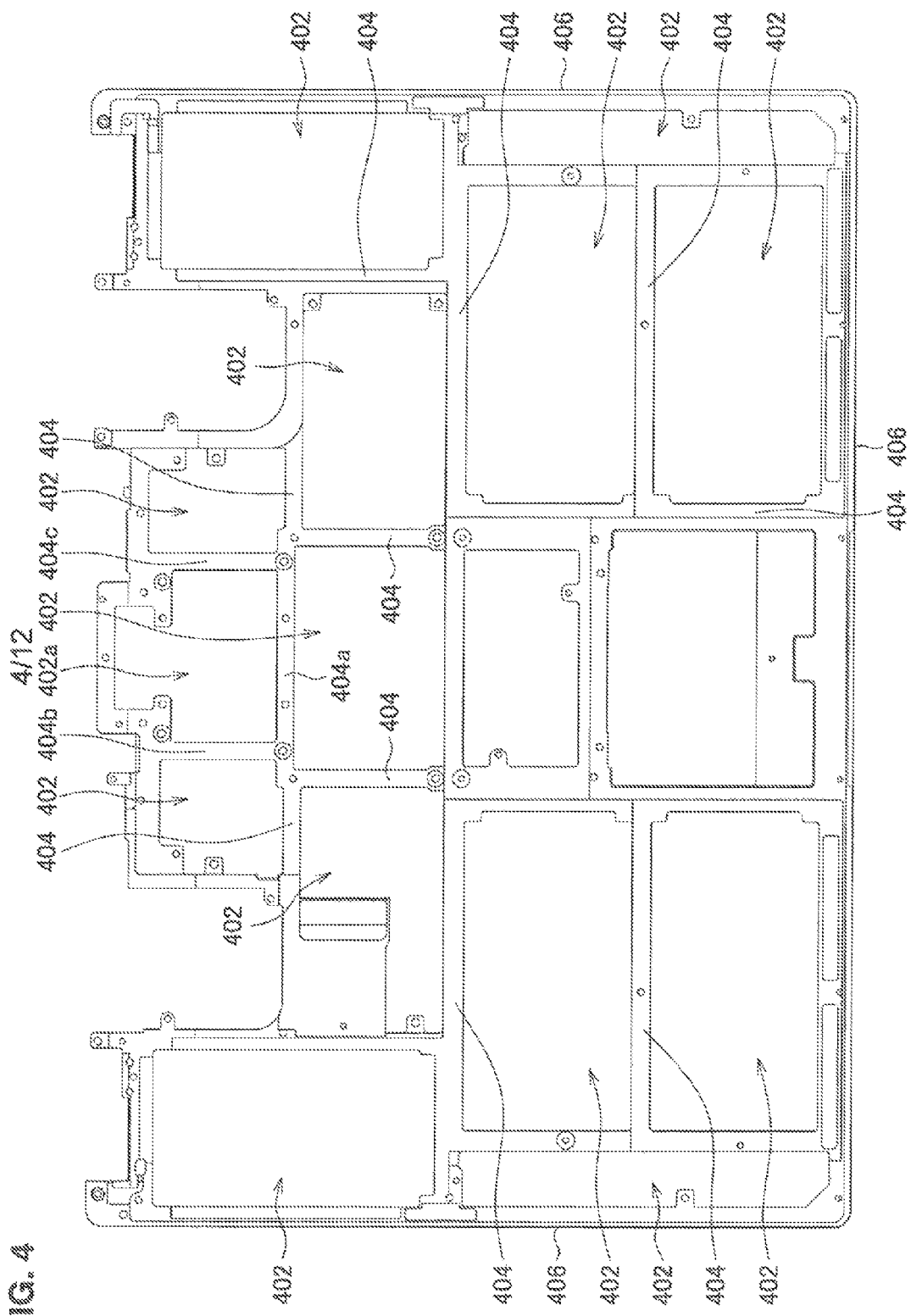
FIG. 4 is a schematic view illustrating a configuration of a frame and is a schematic view illustrating a state in which a frame is viewed from an upper side.

FIG. 4 is a schematic view illustrating a configuration of the frame 400, and illustrates a state in which the frame 400 is viewed from an upper side (the keyboard 208 side). The frame 400 is a member having a predetermined thickness, and is formed in a box structure including a plurality of openings 402 in which parts (modules) such as electronic parts constituting the electronic device 1000 are arranged, as illustrated in FIGS. 3 and 4. The opening 402 is defined by crosspieces 404 provided in the vicinity. Thus, parts can be arranged in the openings 402 and rigidity of the frame 400 can be secured by setting the crosspieces 404 having a predetermined thickness vertically and horizontally to provide the openings 402.

A portion of the frame 400 constitutes an appearance of a main body of the electronic device 1000. A portion including a side surface 406 of the frame 400 is exposed to the outer side of the housing, and constitutes a portion of the side surface and upper and lower surfaces of the main body unit 200. In other words, the frame 400 functions as a member which secures rigidity of the main body unit 200, and also functions as an exterior member. Also, a thickness of the frame 400 is equal to a thickness of the main body unit 200. Therefore, in the electronic device 1000 according to embodiments, an exterior member is not provided in the portion of the side surface and the upper and lower surfaces of the main body unit 200. Accordingly, it is possible to reduce the number of parts.

The frame 400 is formed of, for example, the metal aluminum. When aluminum is used for a material of the frame 400, strength of the frame 400 can be sufficiently secured even when the thickness of the frame 400 is as small as a few mm. Carbon or a metal such as magnesium, a magnesium-lithium alloy, or titanium may be applied as the material of the frame 400 and, in this case, both light weight and high rigidity of the frame can be achieved. Further, when graphite is used, thermal conductivity can be increased, and when stainless steel is adopted, rigidity can be increased. Further, glass or plastic may be adopted and, in this case, there are advantages in terms of a design and cost.

Further, in the openings 402 of the frame 400, various parts such as electronic parts, boards, batteries and the like are arranged to be accommodated in spaces of the openings 402. Therefore, according to the frame 400 of embodiments, a number of electronic parts or the like can be received in the openings 402 and the rigidity can be secured with a minimized thickness thereof.

The bottom plate 202 arranged beneath the frame 400 is formed of a metal plate such as stainless steel having a thickness of about 0.2 mm. A step 400c (see FIG. 10) of about 0.2 mm equivalent to a thickness of the bottom plate 202 is provided in a lower surface of the frame 400, and an area in which the bottom plate 202 is mounted is a surface recessed by one step in comparison with the surroundings. Accordingly, even when the bottom plate 202 is mounted on the lower surface of the frame 400, the thickness of the main body unit 200 is not increased and the entire surface of the housing of the main body unit 200 is a substantially uniform plane. As described above, since the rigidity of the frame 400 is sufficiently secured, the thickness of bottom plate 202 can be minimized. Further, the bottom plate 202 may be used as a marking plate on which information necessary to sell a personal computer as a product is listed. A maker name, a brand name, an identification number of a module, a version of an OS, information on a safety standard, and the like are listed by laser engraving or printing and managed with the marking plate, such that management cost can be reduced and design can be improved by removing a plurality of labels.

Further, the display unit 100 has a frame structure which is not illustrated, similar to the main body unit 200, and the LCD 104 is received to be accommodated in a space formed by openings provided in the frame and the thickness of the frame. This construction enables rigidity to be secured with a minimized thickness of the display unit 100.

[3. Heat Radiation Structure of Main Body Unit]

Figure 5:
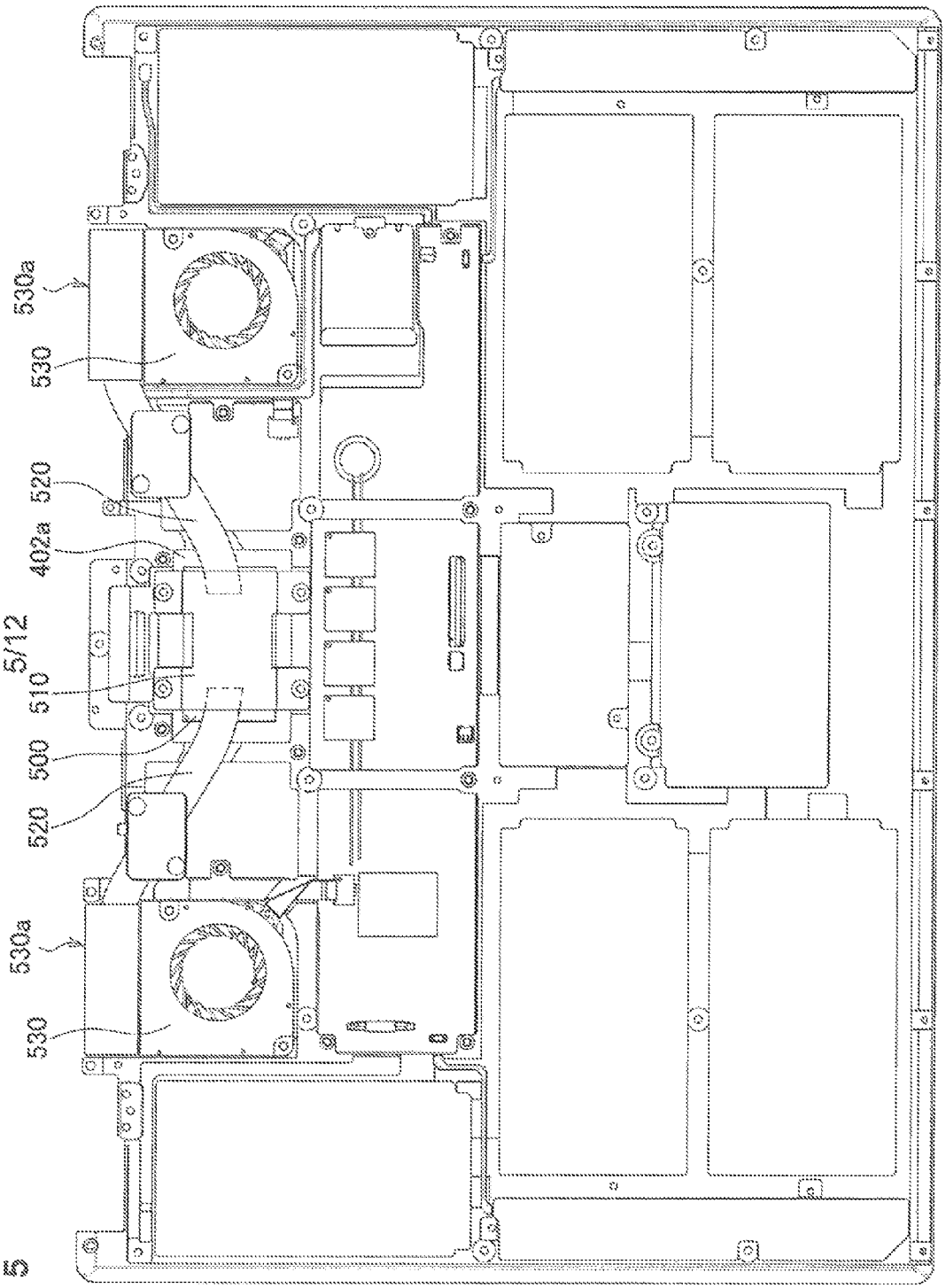
FIG. 5 is a schematic view illustrating a heat radiation structure of the main body unit.

FIG. 5 is a schematic view illustrating a heat radiation structure of the main body unit 200 and illustrates a state in which the frame 400 is viewed from an upper side. A CPU 500 is arranged in an opening 402a of the frame 400 illustrated in FIG. 5. The opening 402a is located on a rear side (a side in which the hinges 300 are provided) of the main body unit 200. A metal presser plate 510 is arranged on the CPU 500. The presser plate 510 is fixed to the crosspieces 404 of the frame 400. A tip of a heat pipe 520 is inserted between the presser plate 510 and the CPU 500. An opposite tip of the heat pipe 520 is introduced into an outlet 530a of a sirocco fan 530. Further, while two types in which the heat pipe is divided at a center have been described as an example of embodiments, for example, one type of heat pipe may be applied and, in this case, a center portion of the heat pipe may be arranged between the presser plate 510 and the CPU 500.

The heat pipe 520 comes in direct contact with the CPU 500 and has a structure of a direct heat pipe, as illustrated in FIG. 5. Such a configuration allows heat generated in the CPU 500 to be delivered to the heat pipe 520 coming in direct contact with the CPU 500, conducted to the outlet 530a of the sirocco fan 530, and radiated toward the outside together with air emitted from the outlet 530a to the outside. Further, the CPU 500 and the heat pipe 520 are fixed to the crosspieces 404 together. Therefore, positioning of the CPU 500 and the heat pipe 520 with respect to the frame 400 can be performed with high precision, and particularly, positions in a height direction of the CPU 500 and the heat pipe 520 can be exactly defined. Therefore, a copper plate (spreader) inserted between the heat pipe 520 and the CPU 500 becomes unnecessary, cost can be reduced, and a thinner main body unit 200 can be realized.

Further, the heat generated in the CPU 500 is delivered to the presser plate 510, delivered from the presser plate 510 to the frame 400 and diffused in a surface direction (horizontal direction) of the frame 400. Since the frame 400 is formed of aluminum, heat is easily delivered, and the heat delivered from a contact portion of the presser plate 510 and the frame 400 to the frame 400 is diffused around the frame 400 through the crosspieces 404. Accordingly, it is possible to efficiently radiate the heat on an entire surface of the frame 400.

Therefore, since the heat generated in the CPU 500 can be rapidly diffused in the surface direction of the frame 400, diffusion of the heat generated in the CPU 500 in a vertical direction of the main body unit 200 can be suppressed. Accordingly, overheating of the motherboard 204 or the keyboard 208 in a position directly on the CPU 500 can be reliably suppressed and overheating of the bottom plate 202 in a position directly beneath the CPU 500 can be reliably suppressed. Therefore, it is possible to reliably suppress formation of a heat spot directly on or beneath the CPU 500.

Figure 6:
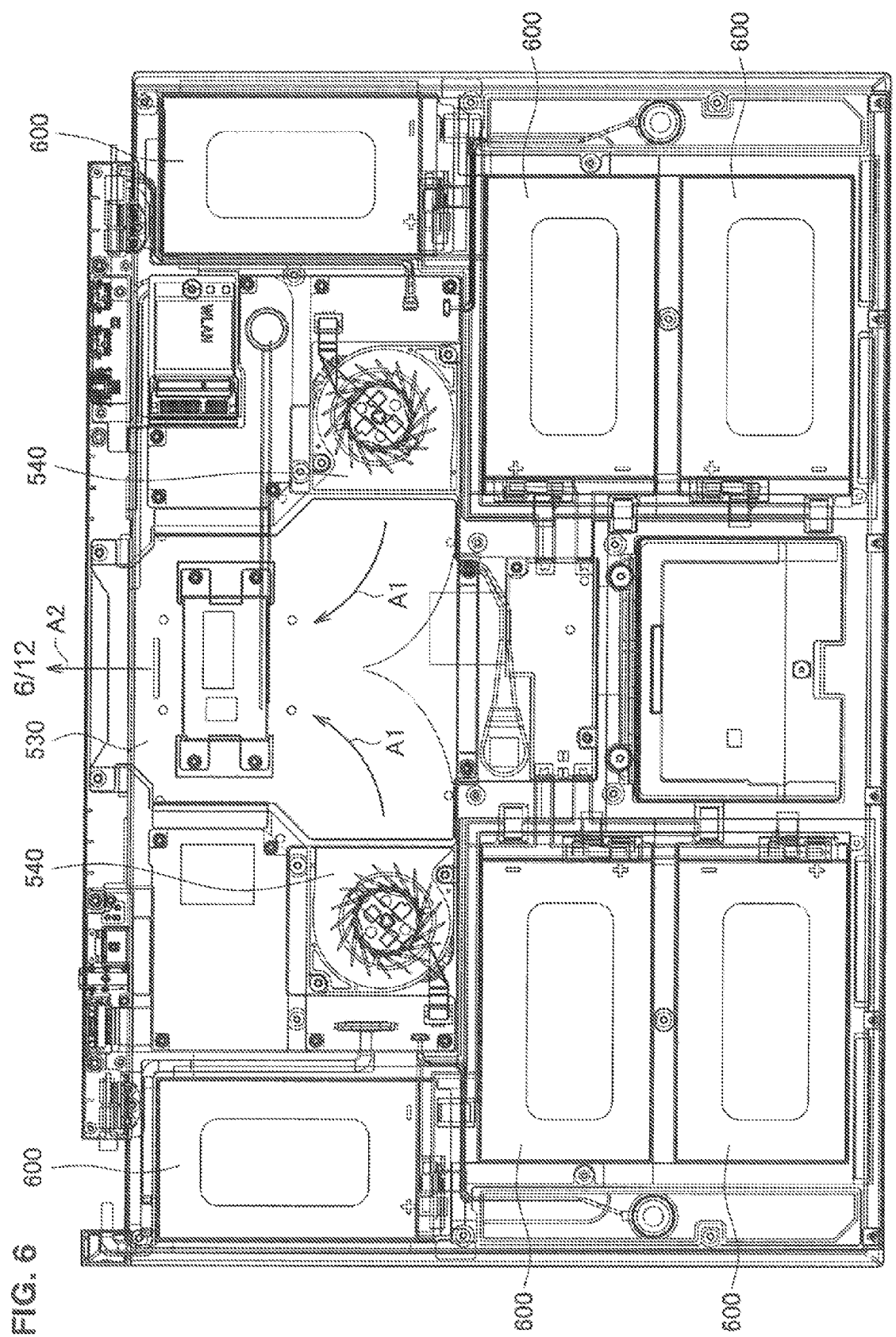
FIG. 6 is a schematic view illustrating another example of the heat radiation structure of the main body unit.

FIG. 6 is a schematic view illustrating another example of a heat radiation structure of the main body unit 200. In an example illustrated in FIG. 6, the heat pipe 520 is not provided, unlike the example of FIG. 5. On the other hand, a metal heat radiation plate 530 is provided in an area in a relatively wide range which covers the CPU 500. A heat radiation plate 530 has the same function as the presser plate 510 illustrated in FIG. 5 and has a function of holding the CPU 500 by closely contacting the CPU 500. Further, the heat radiation plate 530 has a function of diffusing the heat generated in the CPU 500 in the surface direction. Since the heat radiation plate 530 has a larger area than the presser plate 510 illustrated in FIG. 5 and can increase a contact area with the frame 400, diffusion of the heat from the heat radiation plate 530 to the frame 400 can be performed more efficiently. Thus, according to the configuration of embodiments in which the frame 400 itself has a heat radiation structure, a larger contact area between the heat radiation plate 530 and the frame 400 is secured such that the heat generated in the CPU 500 can be reliably radiated from the heat radiation plate 530 to the frame 400 without providing the heat pipe 520. Therefore, it is possible to efficiently radiate the heat in the CPU 500 using a simple configuration.

Further, in the configuration illustrated in FIG. 6, heat radiation by the sirocco fan 540 is performed in addition to the heat radiation by the heat radiation plate 530. A flow path is provided so that an air flow generated by the sirocco fan 540 flows in a direction indicated by an arrow A1 of FIG. 6. Here, in the case of the configuration illustrated in FIG. 6, the crosspieces 404 located in the flow path, including the crosspieces 404a adjacent to the CPU 500 illustrated in FIG. 4 are not provided, while an air passage is formed by the crosspieces 404 around the flow path. Accordingly, the air generated by the sirocco fan 540 flows in a direction indicated by an arrow A2 between the crosspieces 404b and 404c at both sides of the CPU 500 illustrated in FIG. 4, to cool the heat radiation plate 530, the crosspieces 404, and an inner surface of the bottom plate 202, including the CPU 500, and is emitted to the outside. Therefore, it is possible to perform the heat radiation more efficiently using both the heat radiation by the heat radiation plate 530 and the heat radiation by the sirocco fan 540.

The CPU 500 faces the bottom plate 202 on the opposite side of the presser plate 510. A graphite sheet is attached in a position of the bottom plate 202 corresponding to the CPU 500. The graphite sheet is attached, for example, in an area about 5 to 6 times the area of the CPU 500. Accordingly, the heat of the CPU 500 can be diffused horizontally in the graphite sheet and also in a horizontal direction through the frame 400 and the bottom plate 202.

[4. Arrangement of Battery]

Various parts (modules) constituting the electronic device 1000 are arranged in the openings 402 provided in the frame 400. For example, in the example illustrated in FIG. 6, batteries 600 of the electronic device 1000 are arranged in six openings 402. The battery 600 is received in a space formed by the opening 402, the support plate 206 and the bottom plate 202 by the support plate 206 being mounted from an upper side of the frame 400 and the bottom plate 202 being mounted from a lower side thereof.

The thickness of the battery 600 is equal to the thickness of the crosspiece 404. Accordingly, as the support plate 206 is mounted from the upper side of the frame 400 and the bottom plate 202 is mounted from the lower side thereof, an interval between the support plate 206 and the bottom plate 202 is substantially equal to the thickness of the battery 600. Therefore, it is possible to reliably fix the position in the thickness direction of the battery 600 in the space formed by the opening 402, the support plate 206 and the bottom plate 202. Further, the thickness of the battery 600 may be smaller than the thickness of the crosspiece 404. Further, various parts other than the batteries 600 are received in the space formed by the opening 402, the support plate 206 and the bottom plate 202, similar to the batteries 600.

Further, vertical and horizontal lengths in a horizontal direction of the opening 402 into which the battery 600 is inserted are equal to vertical and horizontal lengths of the battery 600. Therefore, the battery 600 can be accommodated in the space formed by the opening 402, the support plate 206 and the bottom plate 202 without a gap and the position in the horizontal direction of the battery 600 can be reliably fixed.

According to the configuration described above, the battery 600 can be configured as a cell and an exterior member such as a battery pack can be omitted. Accordingly, it is possible to minimize the thickness and external form of the battery 600 and achieve a thinner main body unit 200. It is also possible to reduce manufacturing cost since the battery pack becomes unnecessary.

Areas of the six openings 402 in which the batteries 600 are received in embodiments may be different areas. In other words, use of battery cells having different capacities enables the batteries 600 to be arranged using spaces having different sizes defined by the crosspieces 404 efficiently.

[5. Rigidity of Main Body Unit]

In embodiments, it is possible to achieve a thin type of main body unit 200 and greatly increase rigidity of the main body unit 200 by forming the frame 400 in a box structure. It is also possible to achieve a thinner type and higher rigidity by using a lightweight and high-rigidity metal material for the frame 400. In embodiments, the support plate 206 for the keyboard 208 is arranged beneath the keyboard 208, and the motherboard 204 is arranged beneath the support plate 206, as illustrated in FIG. 3.

The crosspieces 404 of the frame 400 are vertically and horizontally arranged below the keyboard 208, as illustrated in FIG. 3. Therefore, when the keyboard 208 is pressed, a pressing force is finally received by the crosspieces 404 of the frame 400 from the support plate 206 through the motherboard 204. In this case, since the crosspieces 404 of the frame 400 are arranged throughout the keyboard 208, the keyboard 208, the support plate 206 and the motherboard 204 do not bend due to the pressing force. Accordingly, it is possible to greatly improve a feeling of manipulation when the keyboard 208 is manipulated.

Figure 7:
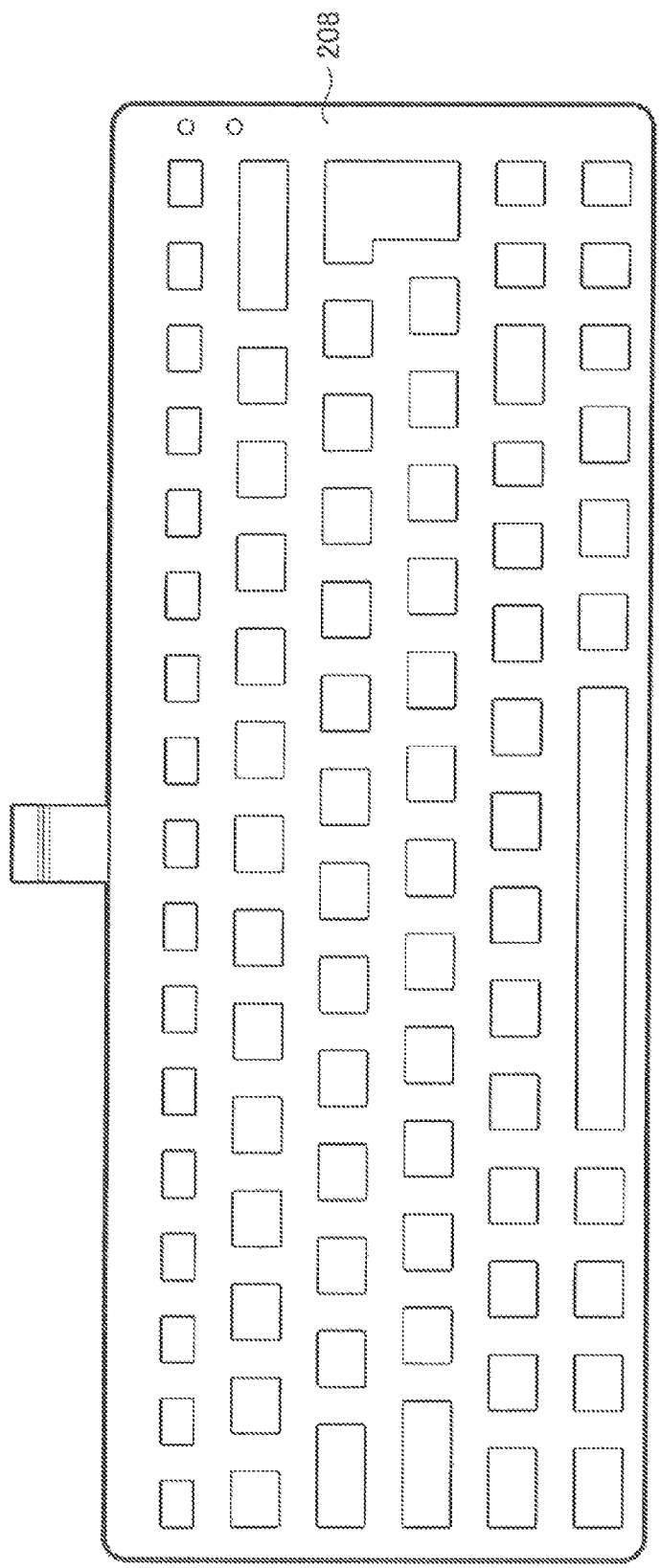
FIG. 7 is a plan view illustrating a keyboard.
Figure 8:
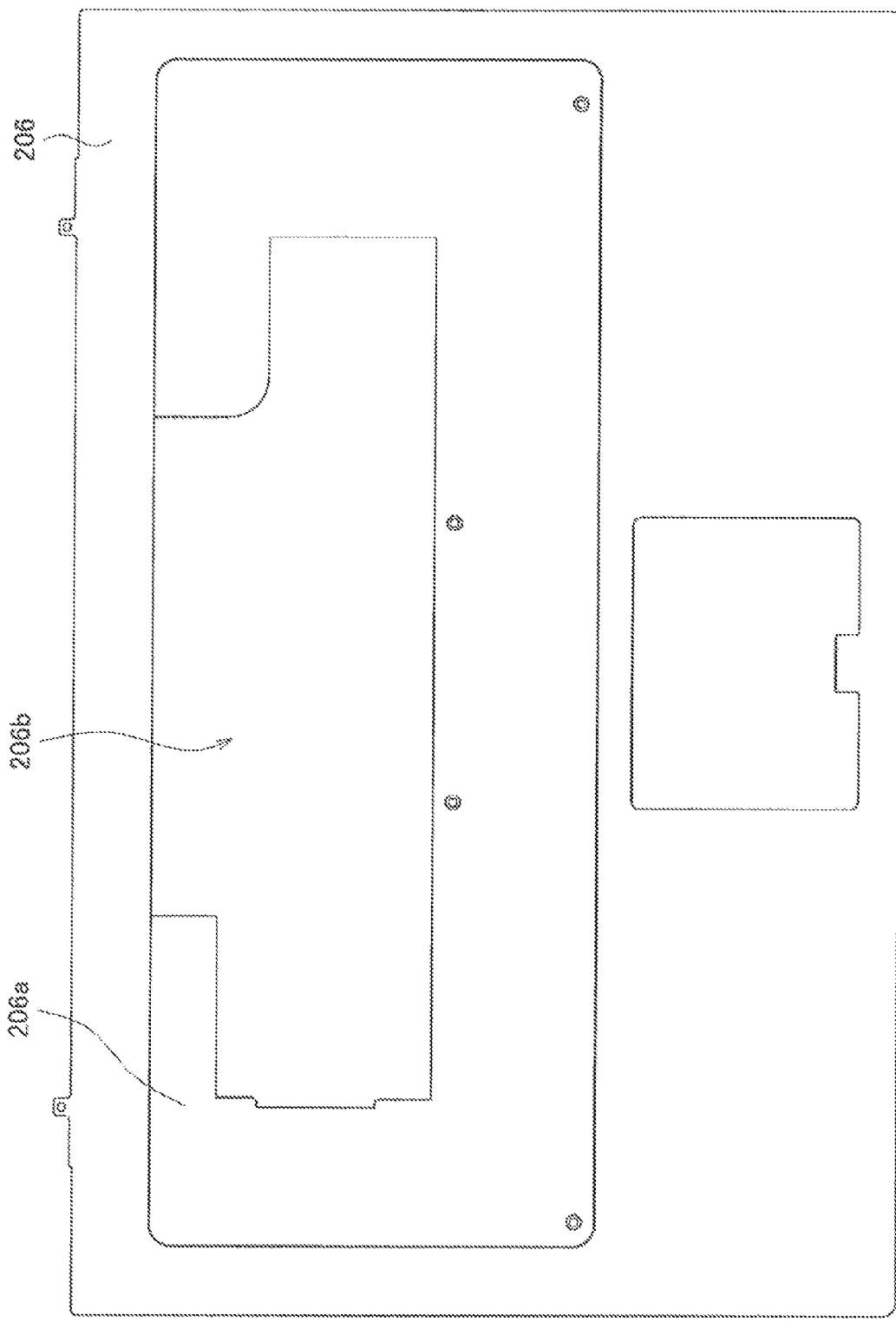
FIG. 8 is a plan view illustrating a support plate of the keyboard.
Figure 9:
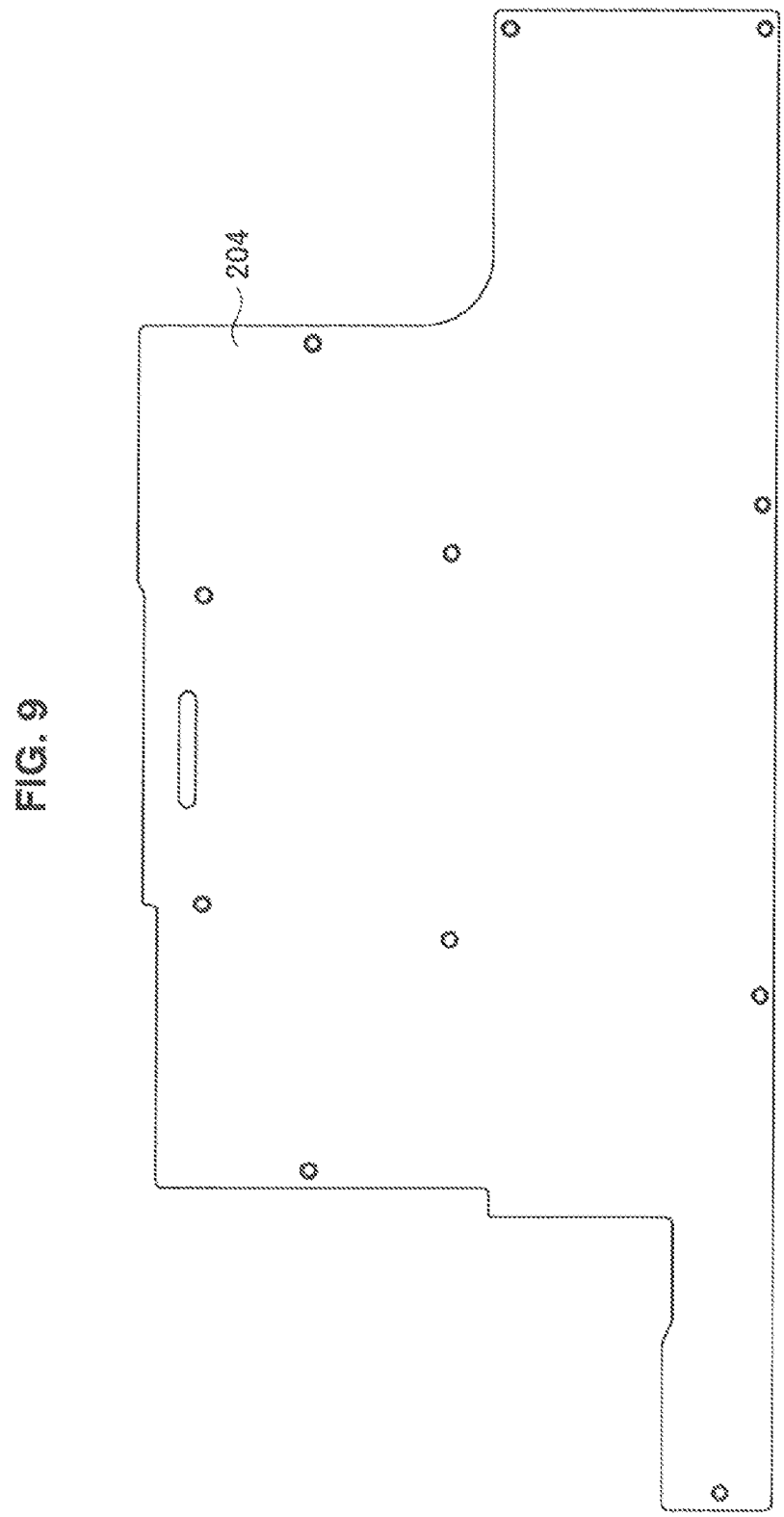
FIG. 9 is a plan view illustrating a motherboard.

Further, according to this configuration, the pressing force of the keyboard 208 can also be received by the motherboard 204. FIGS. 7, 8 and 9 are plan views illustrating the keyboard 208, the support plate 206 and the motherboard 204, respectively. The keyboard 208 is a sheet-type keyboard. The support plate 206 includes a metal plate subjected to press processing, and a surface 206a recessed by one step relative to the surroundings is provided in a top surface of the support plate 206. The keyboard 208 is arranged in the recessed surface 206a of the top surface of the support plate 206. The motherboard 204 is arranged beneath the support plate 206, as illustrated in FIG. 3. In the support plate 206, an opening 206b is provided in a position corresponding to the motherboard 204. In an area outside the opening 206b, the pressing force when the keyboard 208 is pressed is received by the support plate 206. Further, in an area of the opening 206b, the motherboard 204 receives the pressing force when the keyboard 208 is pressed. Therefore, electronic parts are not mounted on a surface of the motherboard 204 on the keyboard 208 side, and are arranged in positions not interfering with the crosspieces 404 on a surface of the motherboard 204 on the frame 400 side. Here, lower surfaces of the support plate 206 and the motherboard 204 are supported by the crosspieces 404 of the frame 400. Therefore, the support plate 206 may not have sufficient rigidity to withstand the pressing force of the keyboard 208 and a thickness of the support plate 206 can be minimized. Accordingly, it is possible to achieve a thinner type of the main body unit 200.

Further, in the area of the opening 206b, the pressing force of the keyboard 208 can be directly received by the motherboard 204. Since the lower surface of the motherboard 204 is supported by the crosspieces 404 of the frame 400, the motherboard 204 may not have rigidity to withstand the pressing force of the keyboard 208 either. Therefore, as the pressing force of the keyboard 208 is received by the motherboard 204, it is unnecessary for the support plate 206 to be provided throughout the keyboard 208. Accordingly, it is possible to further reduce the thickness of the main body unit 200.

As described above, according to embodiments, since the support plate 206 is supported from the bottom by the crosspieces 404 of the frame 400, the support plate 206 itself does not have to have rigidity and can be sufficiently thinned. Further, since the motherboard 204 is supported from the bottom by the crosspieces 404 of the frame 400, the pressing force to the keyboard 208 can be directly received by the motherboard 204 without providing the support plate 206. Accordingly, it is possible to further reduce the thickness of the main body unit 200 and realize a thin type of electronic device 1000.

Meanwhile, in a normal laptop-type personal computer which does not include the frame 400 as shown in these embodiments, it is necessary to sufficiently increase the thickness of the support plate to be arranged beneath the keyboard in order to secure rigidity against the pressing force of the keyboard, and it is necessary to secure the rigidity of components other than the support plate against the pressing force using a housing. Further, in a normal laptop-type personal computer which does not include the frame 400 as shown in these embodiments, it is necessary to provide the support plate to overlap the motherboard since it is difficult for the pressing force of the keyboard to be directly received by the motherboard. Therefore, it is difficult to reduce the thickness of the main body unit.

Further, in the electronic device 1000 of embodiments, it is possible to suppress a stress applied to the display surface 104a when the display unit 100 is closed as illustrated in FIG. 2. FIG. 10 is a schematic view illustrating a configuration for suppressing a stress applied to the display surface 104a, and illustrates a schematic cross-sectional view of the electronic device 1000.

The keyboard 208 according to embodiments adopts a soft-type sheet keyboard rather than a hard type keyboard used in a normal desktop-type personal computer. Therefore, when the display unit 100 as illustrated in FIG. 2 is closed, glass of the display surface 104a is not damaged even when the display surface 104a and the keyboard 208 closely contact each other.

Therefore, when the display unit 100 is closed, the display unit 100 does not bend even when a force is applied in a direction indicated by an arrow A3 in a state in which the display unit 100 is closed as a configuration is made so that the display surface 104a and the surface of the keyboard 208 closely contact each other, as illustrated in FIG. 10. Accordingly, the display surface 104a does not bend due to the force in the direction indicated by the arrow A3, and damage such as cracking of the glass of the display surface 104a can be reliably suppressed.

Further, when the force in the direction indicated by the arrow A3 is applied to the display unit 100, the display surface 104a and the keyboard 208 closely contact each other, and the force in the direction indicated by the arrow A3 applied to the keyboard 208 is delivered to the frame 400 through the support plate 206 and the motherboard 204 below the keyboard 208. Therefore, the force in the direction indicated by the arrow A3 applied to the display unit 100 is finally supported by the crosspieces 404 of the frame 400.

A back surface of the keyboard 208 and the motherboard 204 closely contact each other in the position of the opening 206b of the support plate 206, and the lower surface of the motherboard 204 closely contacts the crosspieces 404 of the frame 400, as illustrated in FIG. 10. Further, in the area outside the opening 206b of the support plate 206, the support plate 206 closely contacts the crosspieces 404. The frame 400 is placed on a placement surface 900 of a desk or the like, and the lower surface of a peripheral edge of the frame 400 and the lower surface of the bottom plate 202 are coplanar due to a step 400c provided in the frame 400 and closely contact the placement surface 900. Therefore, none of the display unit 100, the keyboard 208, the support plate 206 and the motherboard 204, which are formed in plate shapes, bends due to the force in the direction indicated by the arrow A3. Further, the lower surface of the peripheral edge of the frame 400 and the lower surface of the bottom plate 202 are coplanar, and the frame 400 closely contacts the placement surface 900 together with the bottom plate 202. Therefore, the frame 400 does not bend due to the force in the direction indicated by the arrow A3, as well.

As described above, according to the structure of embodiments, each component constituting the electronic device 1000 does not bend even when the force in the direction indicated by the arrow A3 is applied to the display unit 100 in a state in which the display unit 100 is closed. Therefore, each of the display unit 100, the keyboard 208, the support plate 206, the motherboard 204, and the bottom plate 202 can have a thin structure, and a very thin type of electronic device 1000 can be achieved.

FIG. 11 illustrates a schematic cross-sectional view of a normal laptop-type personal computer (PC) 2000 as a comparative example. In the state illustrated in FIG. 11, a display unit 2100 including a display-side housing 2102 and an LCD 2104 is closed with respect to a main body unit 2200, similar to FIG. 10. A keyboard 2208 of the personal computer 2000 is a normal hard-type keyboard. In a state in which the display unit 2100 is closed, a glass 2105 of a front surface of the LCD 2104 closely contacts a cushion 2205 provided in the main body unit 2200. In this case, a clearance (gap) of a distance t is provided between the glass 2105 and the keyboard 2208 in the state in which the display unit 2100 is closed in order to prevent the glass 2105 of the front surface of the LCD 2104 from being damaged. Therefore, when the force is applied to the display unit 2100 in the direction indicated by the arrow A3, the display unit 2100 is likely to bend in a direction in which the clearance disappears and each component constituting the display unit 2100 is likely to be cracked or easily damaged, as illustrated in a figure on a lower side of FIG. 11.

Further, rubber feet 2202 are provided in a bottom surface of the main body unit 2200 of the personal computer 2000. Since these rubber feet 2202 are provided in corners of the bottom surface of the main body unit 2200, a clearance is formed between the bottom surface of the main body unit 2200 and a placement surface. Therefore, when the force in the direction indicated by the arrow A3 is applied to the display unit 2100, the main body unit 2200 is bent in the direction in which the clearance disappears and damaged. Accordingly, since the keyboard 2208 provided in the main body unit 2200, a base member 2209 supporting the keyboard 2208, a motherboard and the like bend, these members are likely to be damaged.

Meanwhile, according to the configuration of an embodiment illustrated in FIG. 10, it is possible to reliably suppress damage of each component of the display unit 100 and the main body unit 200 since none of the components of the display unit 100 and the main body unit 200 bends.

[6. Configuration of Rubber Feet]

Next, a configuration of rubber feet of the electronic device 1000 according to embodiments will be described. FIG. 12 is a schematic view illustrating a configuration of the rubber feet of the electronic device 1000 and illustrates a side view in a state (close) in which the display unit 100 is closed and a side view in a state (open) in which the display unit 100 is opened.

A rubber foot 700 is provided in a portion of an edge at which a side surface on the front side and a bottom surface of the main body unit 200 cross, as illustrated in FIG. 12. A bottom surface of the rubber foot 700 is coplanar to the bottom surface of the main body unit 200. Further, a rubber foot 710 is provided in an end face on a rear side of the display unit 100. An entire surface of the bottom surface of the main body unit 200 closely contacts the placement surface 900 of the desk or the like in the state (close) in which the display unit 100 is closed. Further, the rubber foot 710 does not come in contact with the placement surface 900 in the state in which the display unit 100 is closed.

The rubber foot 710 is located a distance D behind a rotational center O of the hinge 300 in the state (close) in which the display unit 100 is closed, as illustrated in FIG. 12. Therefore, when the display unit 100 is opened, the rubber foot 710 rotates around the rotational center O and contacts the placement surface 900, and the rear side of the main body unit 200 is lifted using the rubber foot 700 on the front side of the main body unit 200 as a fulcrum. Accordingly, the rubber foot 700 on the front side and the placement surface 900 come in contact with each other.

Therefore, the rubber foot 700 and the placement surface 900 come in contact with each other on the front side of the main body unit 200, and the rubber foot 710 mounted on the display unit 100 and the placement surface 900 come in contact with each other on the rear side of the main body unit 200. Accordingly, functions such as vibration absorption, cushioning, and non-slip on the placement surface 900 are exhibited due to the rubber feet 700 and 710. Also, the rubber feet 700 and 710 exhibit their functions only in a state in which the display unit 100 is opened. Since the rubber feet 700 and 710 do not project downward in the thickness direction of the electronic device 1000 in the state in which the display unit 100 is closed, the thickness of the electronic device 1000 can be minimized.

Figure 13:
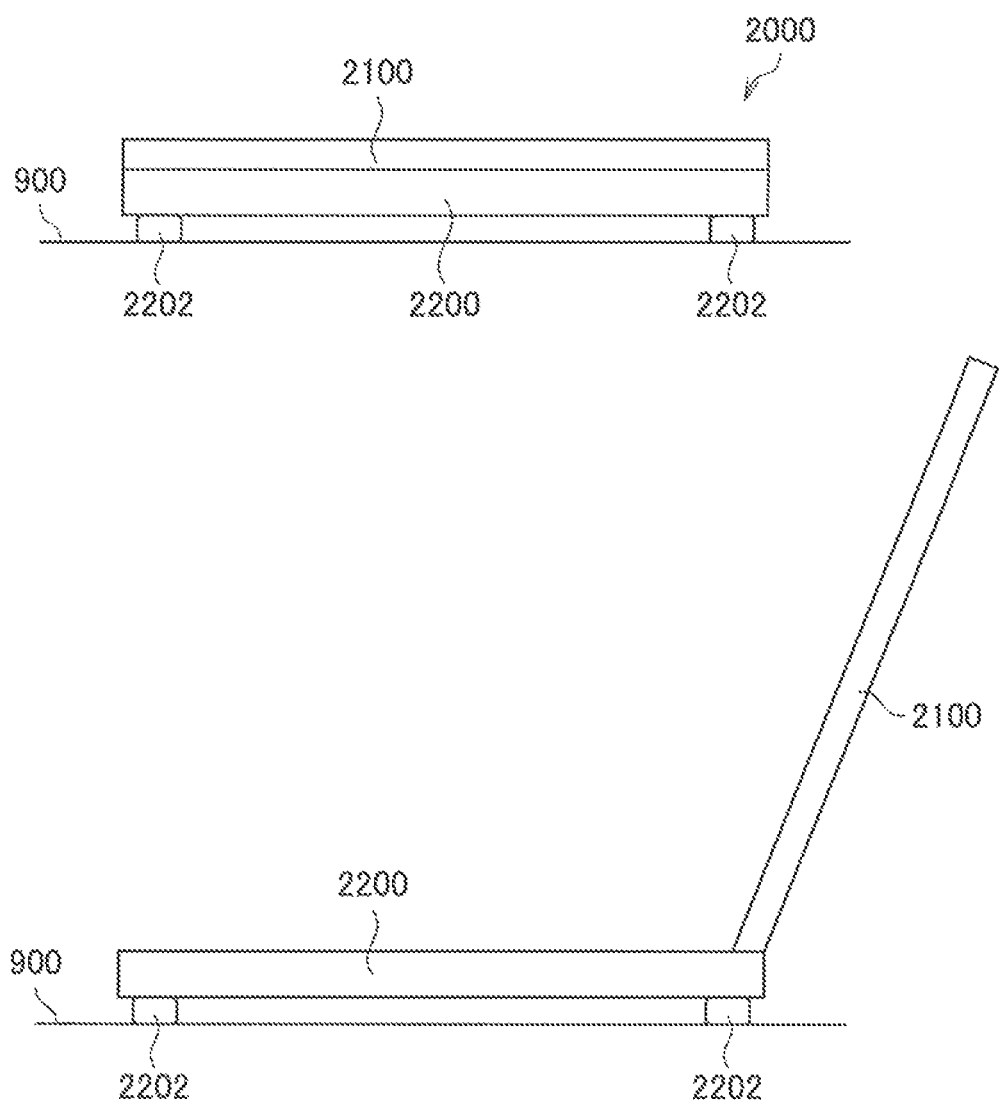
FIG. 13 is a schematic view illustrating a normal laptop-type personal computer as a comparative example.

Meanwhile, FIG. 13 illustrates a normal laptop-type personal computer 2000 as a comparative example. In the normal laptop-type personal computer 2000, rubber feet 2202 project downward from a bottom surface of a main body unit 2200, and a gap of a few mm is created between the bottom surface of the main body unit 2200 and a placement surface 900, as illustrated in FIG. 13. Therefore, a thickness of the personal computer 2000 is increased by an amount to which the rubber feet 2202 project, which obstructs achievement of a thin type.

According to the configuration of the electronic device 2000 of an embodiment illustrated in FIG. 12, since the rubber feet 700 and 710 do not project in the bottom surface of the electronic device 2000 in the state in which the display unit 100 is closed, it is possible to minimize the thickness of the electronic device 2000. Further, it is possible to cause the rubber feet 700 and 710 to exhibit functions such as vibration absorption, non-slip or the like since the rubber feet 700 and 710 come in contact with the placement surface 900 in the state in which the display unit 100 is opened.

While the embodiments of the present disclosure have been described above in detail with reference to the accompanying drawings, a technical scope of the present disclosure is not limited to such examples. It is apparent to those skilled in the art in the technical field of the present disclosure that various change examples or modification examples can be made in a category of technical spirit defined in claims, and it is understood that these belong to the technical scope of the present disclosure.

For example, while the case in which the frame structure is applied to the laptop-type personal computer has been described as embodiments of the present disclosure, the disclosure is not limited thereto and the present frame structure may be adopted in electronic devices such as a hybrid-type personal computer in which the display unit 100 slides and tilts with respect to the main body unit 200, a separate-type computer in which a main body unit and a display unit are received in the same housing and a keyboard is provided in a separate body, a tablet terminal, or a smartphone.

Additionally, the present technology may also be configured as below.

(1) A portable apparatus including:
    a top layer portion;
    a bottom layer portion; and
    a frame layer portion provided between the top layer portion and the bottom layer portion,
    wherein the frame layer portion is formed of a rigid material and comprises a plurality of compartmented openings, and
    wherein the compartmented openings are formed as volumes of spaces partitioned by an arrangement of crosspiece portions forming at least a part of the frame layer portion, and a circuitry component constituting a part of the portable apparatus is placed within at least one of the compartmented openings.

(2) The portable apparatus of (1), wherein the frame layer portion is formed of a thickness greater than or equal to a maximum thickness of components that are placed within the compartmented openings.

(3) The portable apparatus of (1) or (2), wherein the frame layer portion is formed to abut a plurality of side surfaces of the portable apparatus.

(4) The portable apparatus of any of (1) through (3), wherein a plurality of side surfaces of the frame layer portion are configured to form external side surfaces of the portable apparatus.

(5) The portable apparatus of any of (1) through (4), wherein the top layer portion is a keyboard layer or a display-side housing of the portable apparatus.

(6) The portable apparatus of any of (1) through (5), wherein the top layer portion is the keyboard layer, a support plate is provided beneath the keyboard layer and the support plate is mounted from an upper side of the frame layer portion, and the bottom layer portion is mounted from a lower side of the frame layer portion.

(7) The portable apparatus of any of (1) through (6), wherein the frame layer portion suppresses a torsional flex and is configured to secure rigidity of the portable apparatus.

(8) The portable apparatus of any of (1) through (7), wherein at least one of a battery component, a network communication module, and a cooling fan is secured within at least one compartmented opening of the frame layer portion.
(9) The portable apparatus of any of (1) through (8), wherein a plurality of battery cells are secured within corresponding ones of the plurality of compartmented openings of the frame layer portion.
(10) The portable apparatus of any of (1) through (9), wherein two cooling fans are secured within corresponding ones of the plurality of compartmented openings of the frame layer portion.
(11) The portable apparatus of any of (1) through (10), wherein a processor module is provided to be affixed between the two cooling fans.
(12) The portable apparatus of any of (1) through (11), wherein the two cooling fans generate an air flow having a flow path that flows across an exterior face of the processor module.
(13) The portable apparatus of any of (1) through (12), wherein the processor module is secured within one of the compartmented openings of the frame layer portion.
(14) The portable apparatus of any of (1) through (13), wherein the frame layer portion is configured to function as a heat sync of heat generated by a processor module.
(15) The portable apparatus of any of (1) through (14), further including a heat pipe that connects the processor module to one of the crosspiece portions of the frame layer portion, the heat pipe configured as a conduit for heat transfer between the processor module and the one of the crosspiece portions.
(16) The portable apparatus of any of (1) through (15), wherein a plurality of circuitry components of the portable apparatus are affixed to the crosspiece portions of the frame layer portion.
(17) The portable apparatus of any of (1) through (16), wherein the plurality of circuitry components are affixed to be secured within the volumes of spaces of the compartmented openings of the frame layer portion.
(18) The portable apparatus of any of (1) through (17), wherein the bottom layer portion is arranged to be fixed within a concave portion of the frame layer portion.
(19) The portable apparatus of any of (1) through (18), wherein the portable apparatus is a notebook computer or a tablet computer.
(20) A portable apparatus including:
a top layer portion;
a bottom layer portion; and
a frame layer portion provided between the top layer portion and the bottom layer portion,
wherein the frame layer portion is a torsionally rigid structure and comprises a plurality of cutout portions configured to accommodate a plurality of electronic components therewithin.
(21) A frame structure of an electronic device, including:
crosspieces extending in a surface direction, the crosspieces partitioning the frame structure; and
a plurality of openings in which parts are arranged.
(22) The frame structure of an electronic device according to (21), wherein at least some of the crosspieces surrounding a peripheral edge of the frame are configured as an exterior member of the electronic device.
(23) The frame structure of an electronic device according to (21) or (22), wherein a thickness of the crosspiece in a direction perpendicular to the surface direction is substantially equal to a thickness of the part or the thickness of the part is smaller than the thickness of the crosspiece in the vertical direction.
(24) The frame structure of an electronic device of any of (21) through (23), further including two plate members between which the parts arranged in the openings are sandwiched between both sides in the direction perpendicular to the surface direction.
(25) The frame structure of an electronic device of any of (21) through (24), further including:
a CPU arranged in one of the plurality of openings; and
a heat pipe which comes in direct contact with the CPU and is fixed to the crosspiece.
(26) The frame structure of an electronic device of any of (21) through (25), further including:
a CPU arranged in one of the plurality of openings; and
a heat radiation plate which comes in surface contact with the CPU and is fixed to the crosspiece.
(27) The frame structure of an electronic device of any of (21) through (26), further including:
two fans which perform air blowing on the CPU and the heat radiation plate,
wherein the fans diffuse heat of the heat radiation plate, and
wherein the crosspieces define a passage of air from the fans.
(28) The frame structure of an electronic device of any of (21) through (27), wherein a battery cell is arranged in the opening.
(29) The frame structure of an electronic device of any of (21) through (28), further including:
a plate member which closes the opening from a bottom surface side in a direction perpendicular to the surface direction,
wherein the plate member is mounted on a step recessed by a thickness of the plate member such that an entire surface of the bottom surface is coplanar.

What is claimed is:
1. A portable apparatus comprising:
a top layer portion;
a bottom layer portion; and
a frame layer portion provided between the top layer portion and the bottom layer portion,
wherein the frame layer portion is formed of a rigid material and comprises a plurality of compartmented openings,
wherein the compartmented openings are formed as volumes of spaces partitioned by an arrangement of crosspiece portions forming at least a part of the frame layer portion, and a circuitry component constituting a part of the portable apparatus is placed within at least one of the compartmented openings, and
wherein the bottom layer portion is arranged to be fixed within a concave portion of the frame layer portion.
2. The portable apparatus of claim 1, wherein the frame layer portion is formed of a thickness greater than or equal to a maximum thickness of components that are placed within the compartmented openings.
3. The portable apparatus of claim 1, wherein the frame layer portion is formed to abut a plurality of side surfaces of the portable apparatus.
4. The portable apparatus of claim 1, wherein a plurality of side surfaces of the frame layer portion are configured to form external side surfaces of the portable apparatus.
5. The portable apparatus of claim 1, wherein the top layer portion is a keyboard layer or a display-side housing of the portable apparatus.

6. The portable apparatus of claim 5, wherein the top layer portion is the keyboard layer, a support plate is provided beneath the keyboard layer and the support plate is mounted from an upper side of the frame layer portion, and the bottom layer portion is mounted from a lower side of the frame layer portion.

7. The portable apparatus of claim 1, wherein the frame layer portion suppresses a torsional flex and is configured to secure rigidity of the portable apparatus.

8. The portable apparatus of claim 1, wherein at least one of a battery component, a network communication module, and a cooling fan is secured within at least one compartmented opening of the frame layer portion.

9. The portable apparatus of claim 1, wherein a plurality of battery cells are secured within corresponding ones of the plurality of compartmented openings of the frame layer portion.

10. The portable apparatus of claim 1, wherein two cooling fans are secured within corresponding ones of the plurality of compartmented openings of the frame layer portion.

11. The portable apparatus of claim 10, wherein a processor module is provided to be affixed between the two cooling fans.

12. The portable apparatus of claim 11, wherein the two cooling fans generate an air flow having a flow path that flows across an exterior face of the processor module.

13. The portable apparatus of claim 11, wherein the processor module is secured within one of the compartmented openings of the frame layer portion.

14. The portable apparatus of claim 1, wherein the frame layer portion is configured to function as a heat sync of heat generated by a processor module.

15. The portable apparatus of claim 14, further comprising a heat pipe that connects the processor module to one of the crosspiece portions of the frame layer portion, the heat pipe configured as a conduit for heat transfer between the processor module and the one of the crosspiece portions.

16. The portable apparatus of claim 1, wherein a plurality of circuitry components of the portable apparatus are affixed to the crosspiece portions of the frame layer portion.

17. The portable apparatus of claim 16, wherein the plurality of circuitry components are affixed to be secured within the volumes of spaces of the compartmented openings of the frame layer portion.

18. The portable apparatus of claim 1, wherein the portable apparatus is a notebook computer or a tablet computer.

19. A portable apparatus comprising:
a top layer portion;
a bottom layer portion; and
a frame layer portion provided between the top layer portion and the bottom layer portion,
wherein the frame layer portion is a torsionally rigid structure and comprises a plurality of cutout portions configured to accommodate a plurality of electronic components therewithin, and
wherein the bottom layer portion is arranged to be fixed within a concave portion of the frame layer portion.

* * * * *